United States Patent
Kikutake et al.

(10) Patent No.: US 6,477,074 B2
(45) Date of Patent: Nov. 5, 2002

(54) SEMICONDUCTOR MEMORY INTEGRATED CIRCUIT HAVING HIGH-SPEED DATA READ AND WRITE OPERATIONS

(75) Inventors: Akira Kikutake, Kawasaki (JP);
Shinichiro Shiratake, Yokohama (JP);
Kuninori Kawabata, Kawasaki (JP)

(73) Assignees: Fujitsu Limited, Kawasaki (JP);
Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/962,147

(22) Filed: Sep. 26, 2001

(65) Prior Publication Data

US 2002/0067642 A1 Jun. 6, 2002

(30) Foreign Application Priority Data

Dec. 5, 2000 (JP) ......................................... 2000-370482

(51) Int. Cl.[7] ................. G11C 5/02; G11C 5/06

(52) U.S. Cl. ................. 365/51; 365/63; 365/72
(58) Field of Search .................. 365/51, 63, 72, 365/230.3

(56) References Cited

U.S. PATENT DOCUMENTS 5,615,166 A * 3/1997 Machida .................. 365/230.8
5,724,281 A * 3/1998 Nagaba ......................... 365/63

* cited by examiner

*Primary Examiner*—Son Mai
(74) *Attorney, Agent, or Firm*—Arent Fox Kintner Plotkin & Kahn, PLLC

(57) ABSTRACT

Read amplifiers are arranged adjacent to each other near the center of an amplifier string, thereby shortening the distances of read data paths from sense amplifiers to the read amplifiers. This can suppress the delay of a read operation caused by the wiring resistance of a data bus line, to realize high-speed read and write operations by reducing the wiring load on data paths in data read and write.

16 Claims, 10 Drawing Sheets

FIG. 4B
FIG. 4A
FIG. 4C
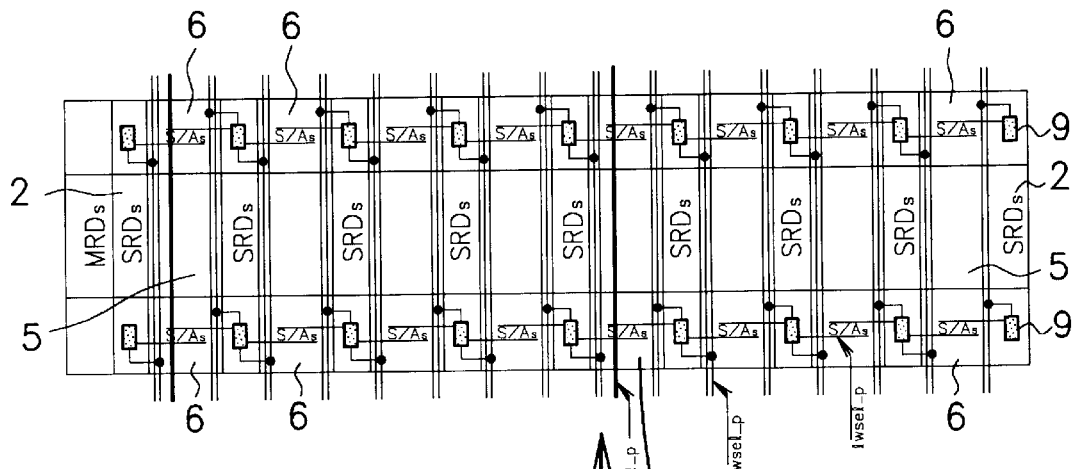
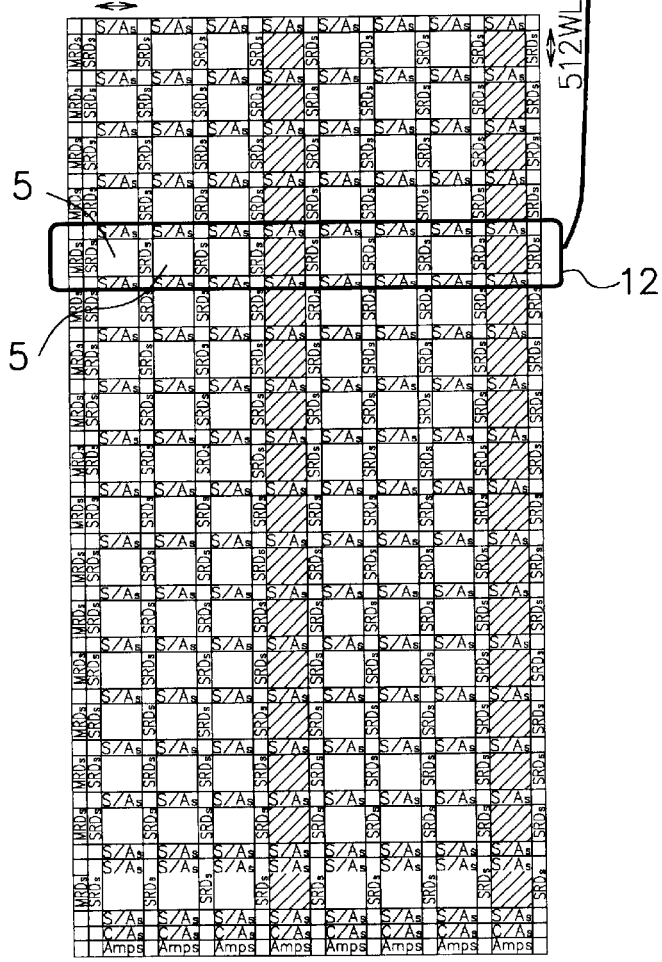

US 6,477,074 B2

SEMICONDUCTOR MEMORY INTEGRATED CIRCUIT HAVING HIGH-SPEED DATA READ AND WRITE OPERATIONS

CROSS-REFERENCE TO RELATED APPLICATIONS

This application is based upon and claims priority of Japanese Patent Application No. 2000-370482, filed on Dec. 5, 2000, the contents being incorporated herein by reference.

BACKGROUND OF THE INVENTION

1. Field of the Invention

The present invention relates to semiconductor memories, in particular, suitably used for reading and writing data using a read amplifier and a write buffer, such as DRAM.

2. Description of the Related Art

FIGS. 9A and 9B show the conventional configuration of a DRAM as a representative example of semiconductor memory. As shown in FIG. 9A, the DRAM 1 of one chip is divided into four banks (Bank0 to Bank3). Each of the banks is further divided into segments 3 by segment row decoder strings 2. Pads 4 are provided in each peripheral circuit disposed between the banks.

FIG. 9B shows the construction of one segment 3 sandwiched by two segment row decoder strings 2. The segment 3 includes memory cell arrays 5 with memory cells, and sense amplifier strings 6 disposed adjacent to the memory cell arrays 5 and each made up from sense amplifiers. The sense amplifiers in the sense amplifier strings 6 are disposed to correspond to the respective memory cells in the memory cell arrays 5.

The segment 3 further includes read amplifier circuits (R/A) 7 and write buffer circuits (W/B) 8 to correspond to units of data DQ. The read amplifier circuits 7 and the write buffer circuits 8 are so arranged as to be alternately adjacent to the corresponding data DQ. Each read amplifier circuit 7 and each write buffer circuit 8 are connected to a read global data bus rgdb_t/c and a write global data bus wgdb_t/c, respectively, which run in a segment direction (row direction). These global data buses rgdb_t/c and wgdb_t/c are connected to a read local data bus rldb_t/c and a write local data bus wldb_t/c, respectively, which run in a sense amplifier string direction (column direction).

Furthermore, first circuits 9 for controlling and driving a local write selection signal lwsel_p are arranged in cross portions (SS-Cross) of the segment row decoder strings 2 and the sense amplifier strings 6. Also, second circuits 10 for controlling and driving a global write selection signal gwsel_p and a write buffer enable signal wep_p are arranged in cross portions of the segment row decoder strings 2 and an amplifier string 17.

In data read, data read out from a predetermined memory cell in the memory cell array 5 is sensed by the corresponding sense amplifier. This data is supplied to the read amplifier 7 via the read local data bus rldb_t/c and the read global data bus rgdb_t/c. The data is then output to the outside through an output circuit (not shown) and the pad 4.

In data write, data input through the pad 4 is supplied to the write buffer 8 via an input circuit (not shown). This write buffer 8 is activated when the write buffer enable signal wep_p supplied from the second circuit 10 is activated. The output signal of the write buffer 8 is supplied to the sense amplifier corresponding to a memory cell, to which data write is to be performed, via the write global data bus wgdb_t/c and the write local data bus wldb_t/c. The data sensed by this sense amplifier is written in the corresponding memory cell.

In this conventional semiconductor memory as shown in FIGS. 9A and 9B, in each segment 3, the read amplifiers 7 and the write buffers 8 are disposed adjacent to the corresponding data DQ, so that these read amplifiers 7 and write buffers 8 are alternately arranged.

In this conventional art, however, the read amplifiers 7 are dispersed in the amplifier string 17 in the segment 3. Therefore, if data read out from a memory cell by activating the sense amplifier closest to the segment row decoder of the segment 3 is to be amplified by the read amplifier 7 closest to the segment row decoder on the opposite side of the segment 3 through the read local data bus rldb_t/c and the read global data bus rgdb_t/c, the read data path from the sense amplifier to the read amplifier 7 is long (FIG. 10A). Consequently, the influence by the wiring resistance may delay the read operation.

Likewise, when write data driven by the write buffer 8 closest to the segment row decoder of the segment 3 is to be supplied to the activated sense amplifier closest to the segment row decoder on the opposite side of the segment 3 through the write global data bus wgdb_t/c and the write local data bus wldb_t/c and written in the corresponding memory cell, the write data path from the write buffer 8 to the sense amplifier is long (FIG. 10B). As a consequence, the influence by the wiring resistance may delay the write operation.

Also, the wiring layouts of control signals for write operations are as follows. Lines for the global write selection signal gwsel_p which is driven from the second circuits 10 to the first circuits 9 can be easily formed. However, the write buffer enable signal wep_p similarly driven from the second circuits 10 is driven long distances to the write buffers 8 dispersed in the amplifier string. In addition, the read amplifiers 7 exist between the write buffers 8. Hence, lines for this signal are difficult to form. That is, the consistency between lines connecting the circuits for write operations is low.

Data read and write operations in a semiconductor memory are important operations in relation to the performance of the memory. Accordingly, it is desirable to rapidly perform these read and write operations.

SUMMARY OF THE INVENTION

It is the first object of the present invention to realize high-speed data read and write operations by reducing the wiring load on data paths in data read and write operations.

It is the second object of the present invention to improve the consistency between lines connecting circuits for write operations.

In a semiconductor memory of the present invention, at least one of read amplifier circuits for amplifying read-out data transferred from a sense amplifier and write buffer circuits for driving write data to the sense amplifier are arranged adjacent to each other.

For example, the distance of a read data path can be shortened by arranging read amplifier circuits adjacent to each other. Also, the distance of a write data path can be shortened by arranging write buffer circuits adjacent to each other.

Furthermore, write buffer circuits are dispersed on both sides of read amplifier circuits arranged adjacent to each other, and a second circuit for controlling and driving a global write selection signal and a write buffer enable signal is disposed at or in the vicinity of a cross portion of a segment row decoder string and an amplifier string. Since the circuits for write operations can be gathered near the segment row decoder string, a wiring layout having high consistency can be formed.

BRIEF DESCRIPTION OF THE DRAWINGS

FIGS. 4A to 4C are diagrams showing write selection signal lines and the structure of a sense amplifier;

DETAILED DESCRIPTION OF THE PREFERRED EMBODIMENTS

Embodiments of the present invention will be described below with reference to drawings.
(First Embodiment)

Figure 1A:
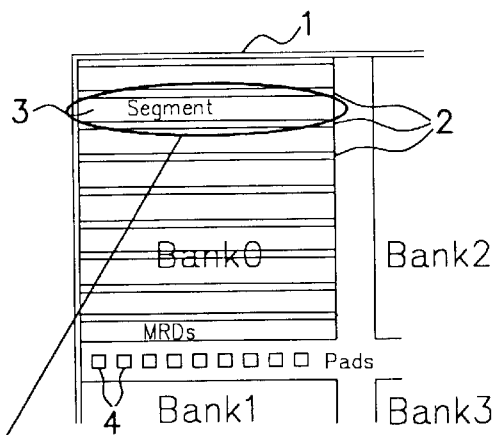
FIGS. 1A and 1B are diagrams showing the configuration of a semiconductor memory according to the first embodiment of the present invention.
Figure 1B:
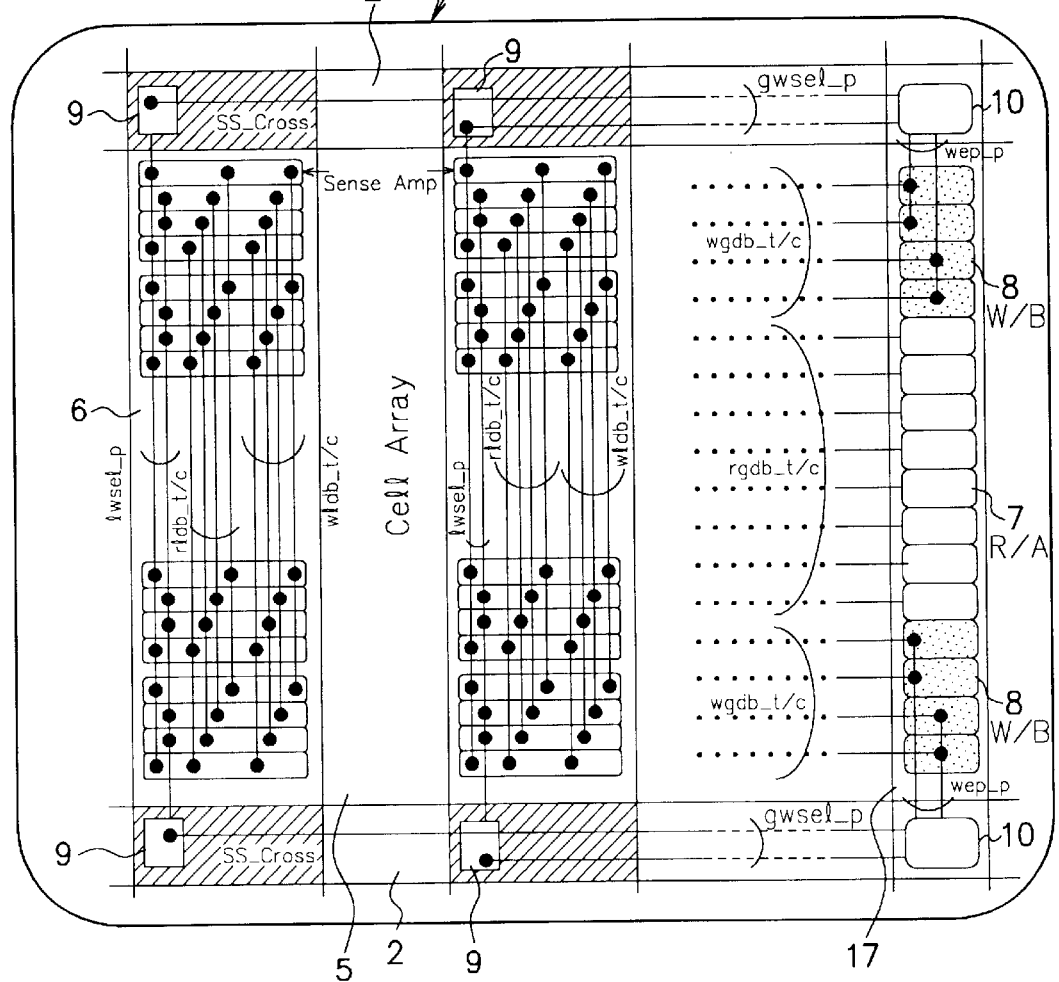
Figure 9A:
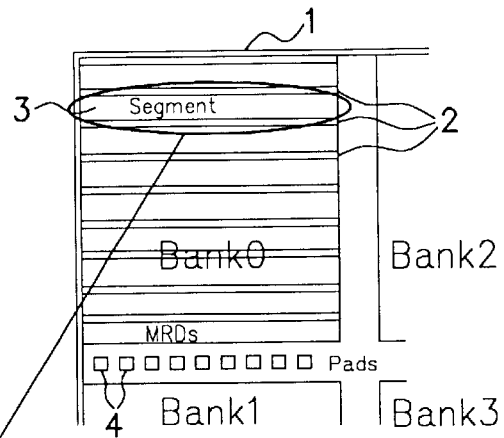
FIGS. 9A and 9B are diagrams showing an example of configuration of a conventional semiconductor memory.
Figure 9B:
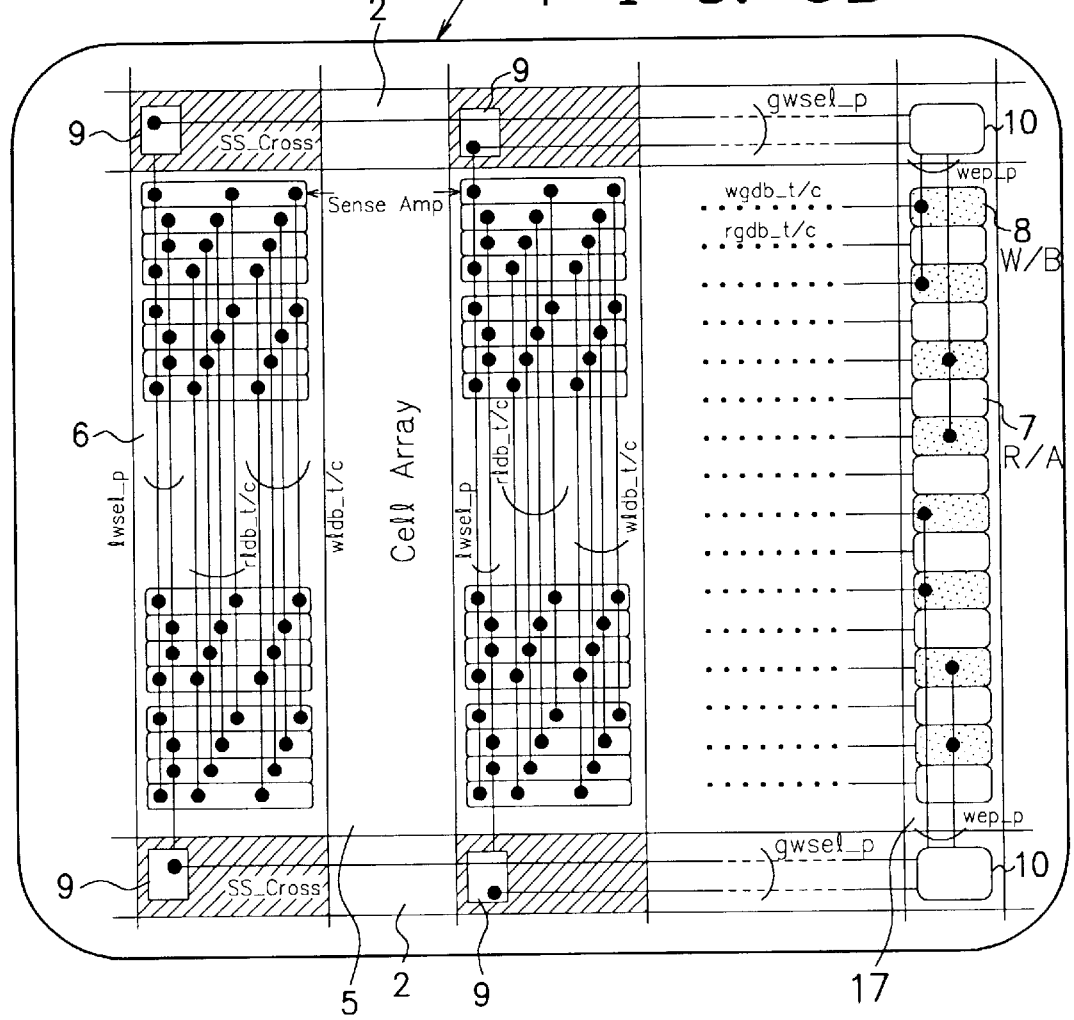
Figure 10A:
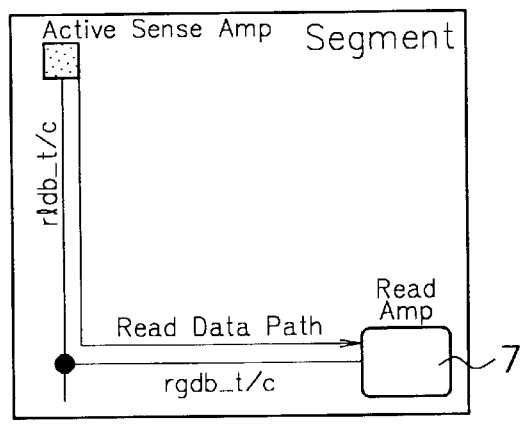
FIGS. 10A and 10B are diagrams showing examples of conventional data paths.
Figure 10B:
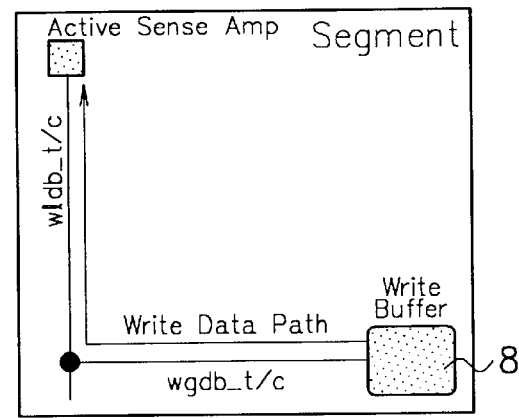

FIGS. 1A and 1B are diagrams showing the configuration of a semiconductor memory according to the first embodiment of the present invention. In FIGS. 1A and 1B, the same reference numerals as in FIGS. 9A and 9B denote the same parts as in FIGS. 9A and 9B, respectively.

Figure 2A:
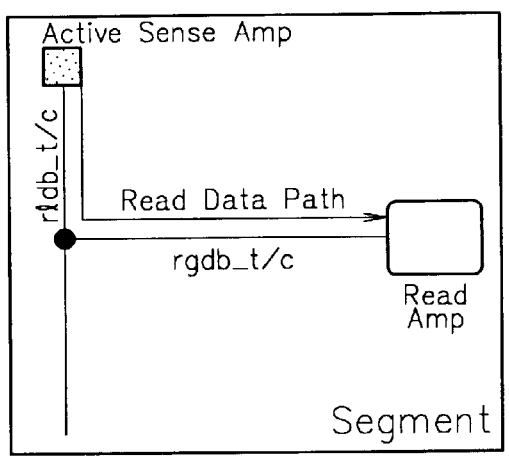
FIGS. 2A and 2B are diagrams showing examples of data paths according to the first to third embodiments of the present invention.

In this first embodiment as shown in FIGS. 1A and 1B, all read amplifiers 7 in a segment 3 are arranged adjacent to each other near the center of an amplifier string 17. With this arrangement, even if data read out by activating the sense amplifier closest to the segment row decoder of the segment 3 is to be amplified by the read amplifier 7 farthest from that sense amplifier, the distance the data travels on a read local data bus rldb_t/c running on a sense amplifier string 6 is shorter than the distance in the conventional semiconductor memory (FIG. 2A). This can suppress the delay of a read operation caused by the wiring resistance.

Also, in the first embodiment shown in FIGS. 1A and 1B, all write buffers 8 are divided into two groups, and write buffers 8 are arranged on either side (at either end of the segment 3) of the read amplifiers 7 gathered near the center. This can shorten the driving distance a write buffer enable signal wep_p driven by a second circuit 10 travels to the write buffer 8, in comparison with the driving distance in the conventional semiconductor memory. In addition, since no read amplifiers 7 exist between these write buffers 8, lines for the write buffer enable signal wep_p are easy to form. Accordingly, lines for a global write selection signal gwsel_p from second circuits 10 to first circuits 9 and lines for the write buffer enable signal wep_p from the second circuits 10 to the write buffers 8 can be formed with high consistency.

Figure 3:
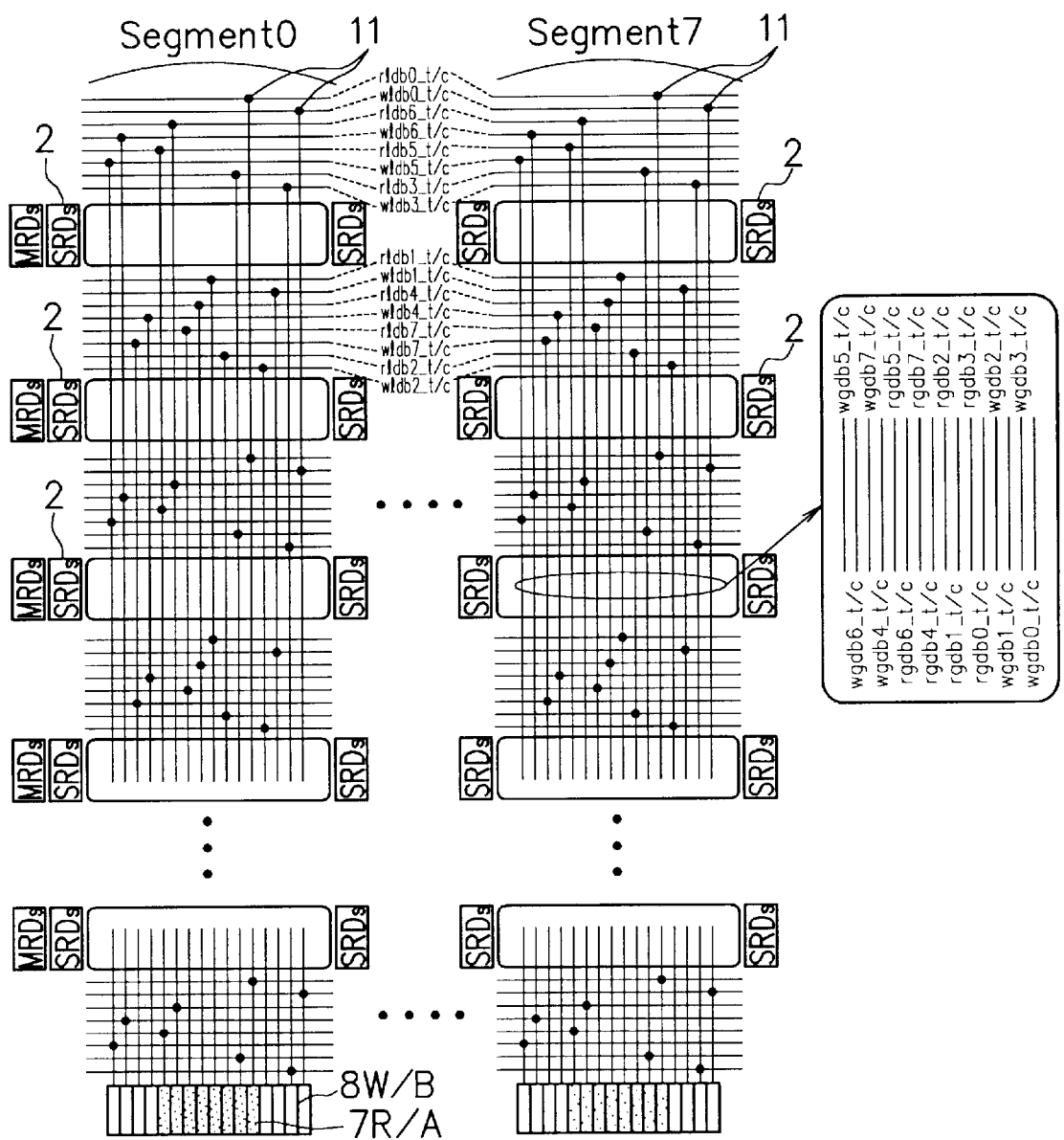
FIG. 3 is a diagram showing the structure of a data bus.

FIG. 3 is a diagram showing the structure of a data bus. As shown in FIG. 3, local data buses rldb#_t/c and wldb#_t/c (#=0, 1, 2, . . . ) running on the sense amplifier string 6 and global data buses rgdb#_t/c and wgdb#_t/c (#=0, 1, 2, . . . ) are connected only by contacts 11. Also, the global data buses rgdb#_t/c and wgdb#_t/c run straightly from the corresponding read amplifier 7 and write buffer 8 in the direction of a memory cell array 5 and connected to the corresponding local data buses rldb#_t/c and wldb#_t/c, respectively, at the shortest distance.

FIGS. 4A to 4C are diagrams showing lines for write selection signals gwsel_p and lwsel_p and the structure of a sense amplifier. FIG. 4A shows the internal construction of one bank constituting a DRAM of one chip. As shown in FIG. 4A, the bank includes blocks 12 in the column direction, each of which includes (e.g., eight) memory cell arrays 5 in the row direction.

FIG. 4B shows the internal construction of one block 12. Sense amplifier strings 6 are formed above and below each memory cell array 5 in the block 12. Also, segment row decoder strings 2 are formed on the left and right sides of each memory cell array 5. First circuits 9 for controlling and driving a local write selection signal lwsel_p are arranged in cross portions of the segment row decoder strings 2 and the sense amplifier strings 6.

FIG. 4C shows the construction of one sense amplifier. As shown in FIG. 4C, the sense amplifier is a direct-type sense amplifier which receives bit lines BL and /BL ("/" indicates the inverted signal) by the gates of n-channel transistors. That is, the bit lines BL and /BL are connected to the gates of two n-channel transistors 13. The bit lines BL and /BL are also connected to the sources or drains of n-channel transistors 15 for selecting a write column line.

The source or drain of each transistor 13 is connected to read local data buses rldb_c and rldb_t through an n-channel transistor 14 for selecting a column line. A read enable signal rdrv_n is input to the drain or source of each n-channel transistor 13. The drain or source of each transistor 15 is connected to write local data buses wldb_c and wldb_t through an n-channel transistor 16 for selecting a column line.

The local write selection signal lwsel_p is driven when the global write selection signal gwsel_p is input from the second circuit 10 to the first circuit 9. In write operation, the write local data bus wldb_t/c is connected to the bit lines BL and /BL through a column selection signal csl_p and the local write selection signal lwsel_p connected in series.

Figure 5:
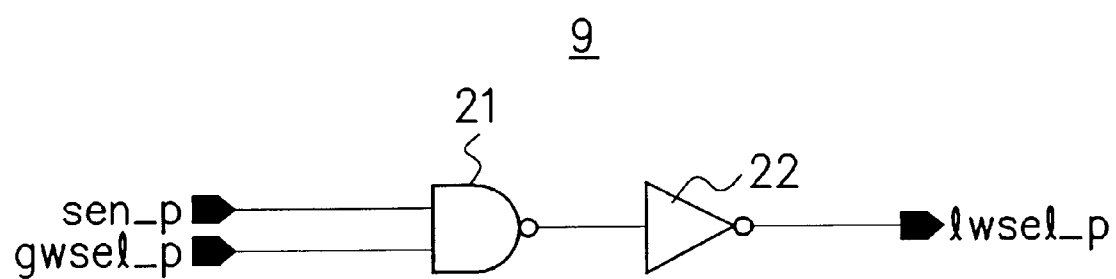
FIG. 5 is a diagram showing an example of construction of a first circuit.

FIG. 5 is a diagram showing an example of construction of the first circuit 9. The first circuit 9 comprises a NAND circuit 21 and an inverter 22. The NAND circuit 21 receives a sense amplifier block selection signal sen_p and the global write selection signal gwsel_p as its two inputs. The inverter 22 inverts the output signal of the NAND circuit 21 to output the local write selection signal lwsel_p. With this construction, the first circuit 9 activates the local write selection signal lwsel_p when the sense amplifier block selection signal sen_p and the global write selection signal gwsel_p are at high level.

Figure 6:
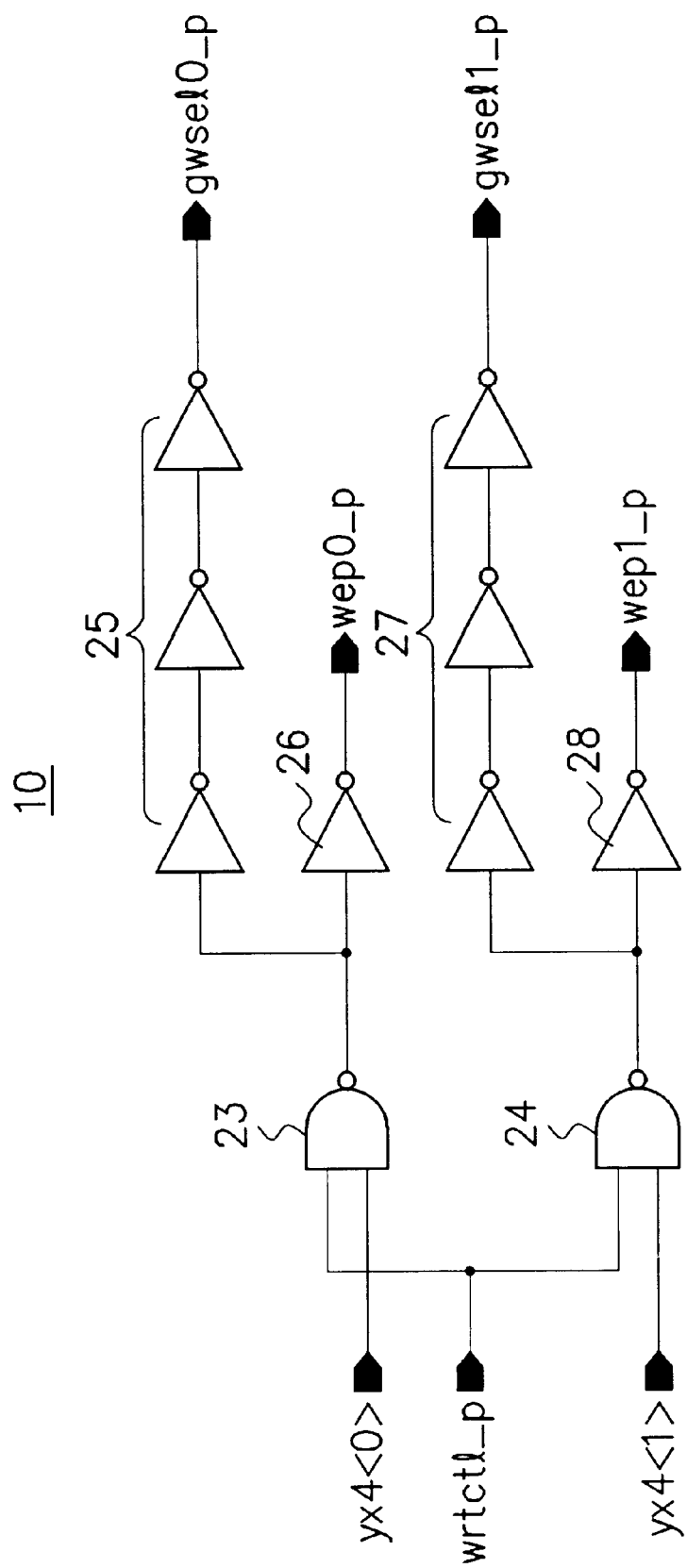
FIG. 6 is a diagram showing an example of construction of a second circuit.

FIG. 6 shows an example of construction of the second circuit 10. The second circuit 10 comprises NAND circuits 23 and 24, three inverters 25, an inverter 26, three inverters 27, and an inverter 28. The NAND circuit 23 receives a write control signal wrtctl_p and a first language construction control signal yx4<0> as its two inputs. The NAND circuit 24 receives the write control signal wrtctl_p and a second language construction control signal yx4<1> as its two inputs. The three inverters 25 invert the logic of the output signal of the NAND circuit 23 to output a global write selection signal gwsel0_p. The inverter 26 inverts the logic of the output signal of the NAND circuit 23 to output a write buffer enable signal wep0_p. The three inverters 27 invert the logic of the output signal of the NAND circuit 24 to output a global write selection signal gwsel1_p. The inverter 28 inverts the logic of the output signal of the NAND circuit 24 to output a write buffer enable signal wep1_p.

The language construction control signals yx4<0> and yx4<1> control the language construction of data to be read out or written, and change to high or low level in accordance with a necessary data language. When 16 units of data DQ are necessary, both the first and second language construction control signals yx4<0> and yx4<1> change to high level. These signals are normally at high level. Hence, when the write control signal wrtctl_p and the language construction control signals yx4<0> and yx4<1> are at high level, the second circuit 10 activates the corresponding global write selection signals gwsel0_p and gwsel1_p and write buffer enable signals wep0_p and wep1_p.

As described above, according to the first embodiment, all the read amplifiers 7 in the segment 3 are arranged near the center of the amplifier string 17 to be adjacent to each other. Accordingly, it is possible to suppress the delay of a read operation caused by the wiring resistance and realize a high-speed read operation.

Besides, according to the first embodiment, write buffers 8 are arranged on either side of the read amplifiers 7, i.e., at either end of the segment 3. Therefore, lines for the global write select signal gwsel_p from the second circuits 10 to the first circuits 9 and lines for the write buffer enable signal wep_p from the second circuits 10 to the write buffers 8 can be arranged with high consistency.

(Second Embodiment)

Figure 7A:
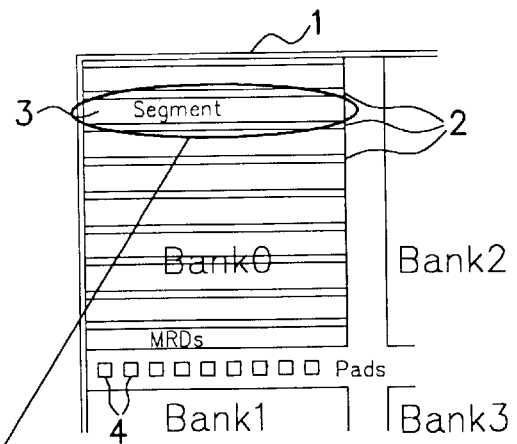
FIGS. 7A and 7B are diagrams showing the configuration of a semiconductor memory according to the second embodiment of the present invention.
Figure 7B:
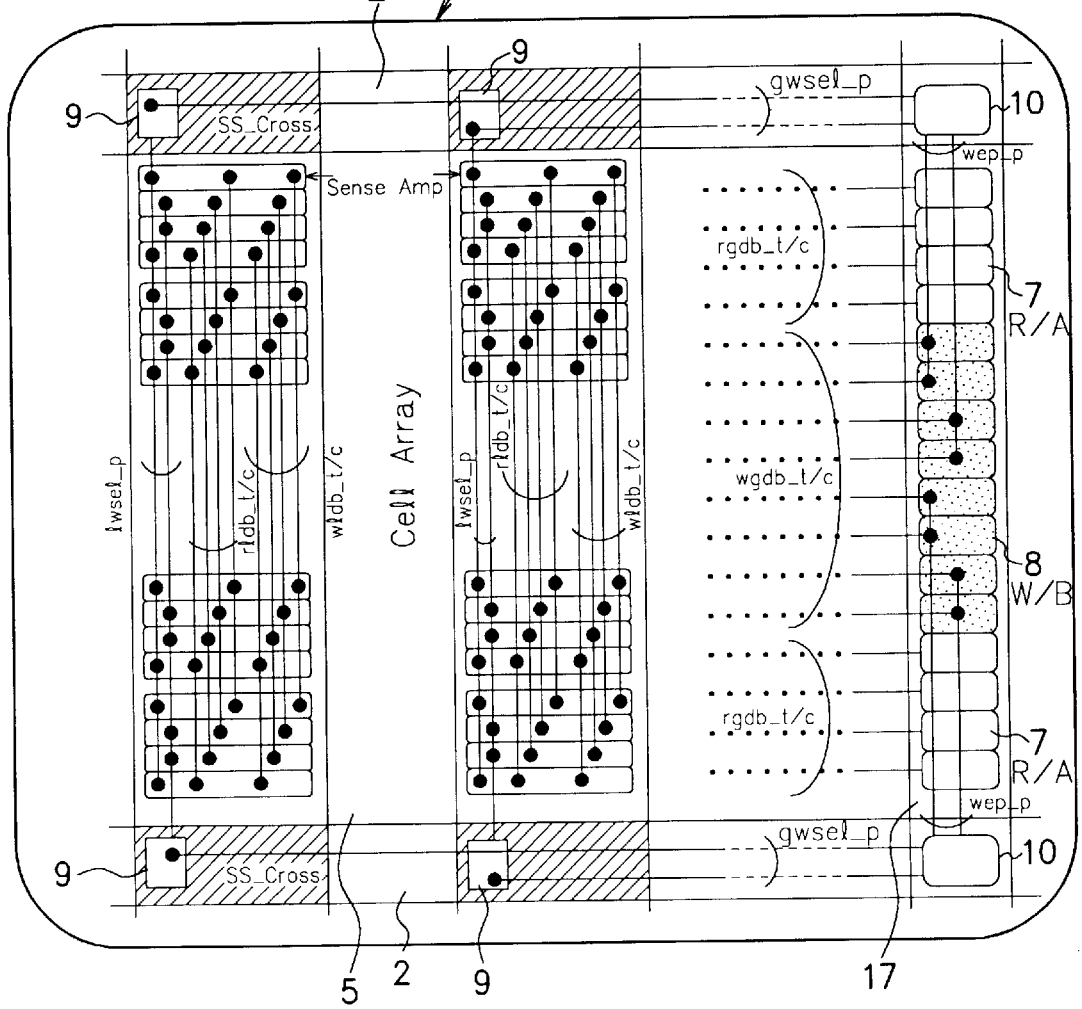

FIGS. 7A and 7B are diagrams showing the configuration of a semiconductor memory according to the second embodiment of the present invention. In FIGS. 7A and 7B, the same reference numerals as in FIGS. 1A and 1B denote the same parts as in FIGS. 1A and 1B, respectively.

Figure 2B:
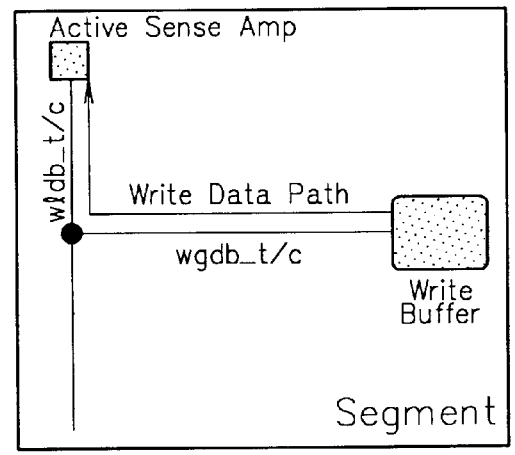

In this second embodiment as shown in FIGS. 7A and 7B, all write buffers 8 in a segment 3 are arranged adjacent to each other near the center of an amplifier array 17, and two groups of read amplifiers 7 are disposed on both sides of the write buffers 8. With this construction, even if write data driven by the write buffer 8 closest to the segment row decoder of the segment 3 is to be written by the sense amplifier farthest from that write buffer 8, the distance the data travels on a write local data bus wldb_t/c running on a sense amplifier string 6 is shorter than the distance in the conventional semiconductor memory (FIG. 2B). This can suppress the delay of a write operation caused by the wiring resistance.

The delay of a read operation can be suppressed particularly in the first embodiment, while the delay of a write operation can be suppressed particularly in the second embodiment. One of these configurations can be selected in accordance with which of the read rate and write rate is important. When improving the consistency between lines for write operations is also important, the configuration of the first embodiment can be selected.

(Third Embodiment)

Figure 8A:
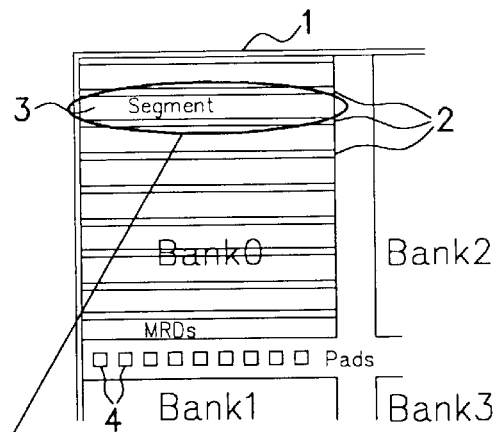
FIGS. 8A and 8B are diagrams showing the configuration of a semiconductor memory according to the third embodiment of the present invention.
Figure 8B:
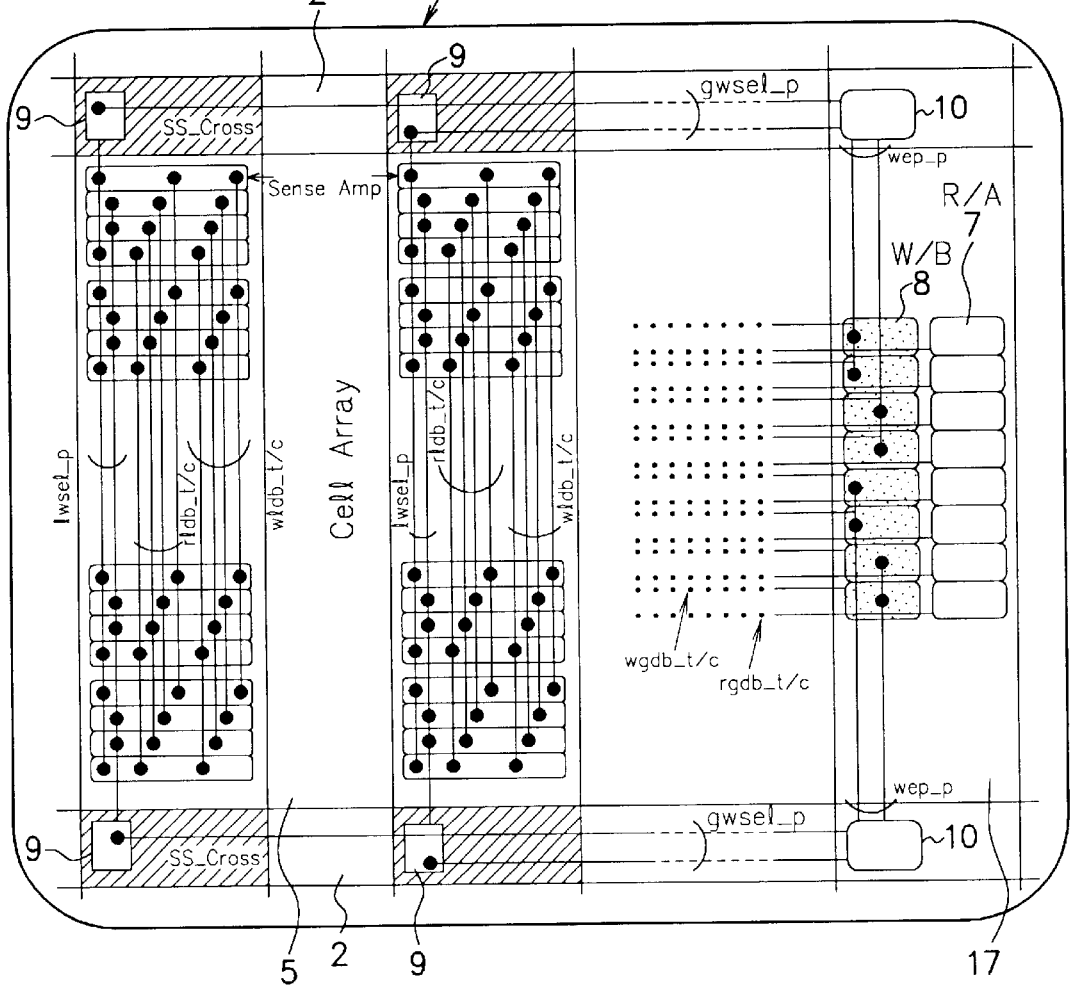

FIGS. 8A and 8B show the configuration of a semiconductor memory according to the third embodiment of the present invention. In FIGS. 8A and 8B, the same reference numerals as in FIGS. 1A and 1B denote the same parts as in FIGS. 1A and 1B, respectively.

In this third embodiment as shown in FIGS. 8A and 8B, all read amplifiers 7 in a segment 3 are arranged adjacent to each other near the center of an amplifier string 17, and all write buffers 8 in the segment 3 are also arranged adjacent to each other near the center of the amplifier string 17, so that read amplifiers 7 and write buffers 8 are juxtaposed. In this configuration, both the read data paths and write data paths can be shortened in comparison with those of the conventional semiconductor memory. This makes it possible to suppress the delays of both the read and write operations caused by the wiring resistance.

In this third embodiment shown in FIGS. 8A and 8B, the interval between a read global data bus rgdb_t/c and a write global data bus wgdb_t/c is narrower than in the first and second embodiments shown in FIGS. 1A, 1B, 7A, and 7B. This may generate capacitive noise between these buses. To prevent the generation of this noise, therefore, shielded lines can be used as the read global data bus rgdb_t/c and the write global data bus wgdb_t/c.

Each embodiment described above is merely a practical example for carrying out the present invention, so the technical scope of the present invention should not be limitedly interpreted by these embodiments. That is, the present invention can be carried out in various forms without departing from its spirit or its main characteristic features.

In the present invention, as described above, read amplifier circuits are arranged adjacent to each other, thereby shortening the distances of read data paths. This can suppress the delay of a read operation caused by the wiring resistance of a data bus line. Also, write buffer circuits are arranged adjacent to each other, thereby shortening the distances of write data paths. This can suppress the delay of a write operation caused by the wiring resistance of a data bus line.

Furthermore, write buffer circuits are dispersed on both sides of read amplifier circuits arranged adjacent to each other, and a second circuit for controlling and driving a global write selection signal and a write buffer enable signal are arranged at or in the vicinities of a cross portion of a segment row decoder string and an amplifier string. Since the circuits for write operations can be gathered near the segment row decoder string, a wiring layout having high consistency can be realized.

What is claimed is:

1. A semiconductor memory comprising:
    read amplifier circuits for amplifying read-out data transferred from sense amplifiers; and
    write buffer circuits for driving write data to said sense amplifiers,
    wherein said read amplifier circuits are arranged adjacent to each other, or said write buffer circuits are arranged adjacent to each other.

2. The memory according to claim 1, wherein said read amplifier circuits are arranged adjacent to each other, and said write buffer circuits are dispersed on both sides of said read amplifier circuits.

3. The memory according to claim 2, wherein each of said sense amplifiers is activated with a local write selection signal in write operation, and said local write selection signal is driven by a first circuit disposed at a cross portion of a sense amplifier string and a segment row decoder string.

4. The memory according to claim 3, wherein said first circuit is controlled with a global write selection signal, each of said write buffer circuits is controlled with a write enable signal to be activated, and said global write selection signal and said write enable signal are controlled with a control signal to be activated.

5. The memory according to claim 4, wherein a second circuit for controlling and driving said global write selection signal and said write enable signal is disposed at or in the vicinity of a cross portion of said segment row decoder string and an amplifier string.

6. The memory according to claim 4, wherein said first circuit comprises:

a NAND circuit having an input for said global write selection signal; and an inverter for receiving an output signal of said NAND circuit to output said local write selection signal.

7. The memory according to claim 5, wherein said second circuit comprises:

a NAND circuit having an input for said control signal for activating said global write selection signal and said write enable signal;

a first inverter for receiving an output signal of said NAND circuit to output said global write selection signal; and a second inverter for receiving an output signal of said NAND circuit to output said write enable signal.

8. The memory according to claim 1, wherein said write buffer circuits are arranged adjacent to each other, and said read amplifier circuits are dispersed on both sides of said write buffer circuits.

9. The memory according to claim 8, wherein each of said sense amplifiers is activated with a local write selection signal in write operation, and said local write selection signal is driven by a first circuit disposed at a cross portion of a sense amplifier string and a segment row decoder string.

10. The memory according to claim 9, wherein said first circuit is controlled with a global write selection signal, each of said write buffer circuits is controlled with a write enable signal to be activated, and said global write selection signal and said write enable signal are driven by a second circuit disposed at or in the vicinity of a cross portion of said segment row decoder string and an amplifier string.

11. The memory according to claim 1, wherein said read amplifier circuits are arranged adjacent to each other, and said write buffer circuits are arranged adjacent to each other.

12. The memory according to claim 11, wherein each of said sense amplifiers is activated with a local write selection signal in write operation, and said local write selection signal is driven by a first circuit disposed at a cross portion of a sense amplifier string and a segment row decoder string.

13. The memory according to claim 12, wherein said first circuit is controlled with a global write selection signal, each of said write buffer circuits is controlled with a write enable signal to be activated, and said global write selection signal and said write enable signal are driven by a second circuit disposed at or in the vicinity of a cross portion of said segment row decoder string and an amplifier string.

14. The memory according to claim 1, wherein said read amplifier circuits are arranged adjacent to each other, said write buffer circuits are divided into two groups including substantially the same number of circuits, and said two groups are disposed on both sides of said read amplifier circuits.

15. The memory according to claim 1, wherein said write buffer circuits are arranged adjacent to each other, said read amplifier circuits are divided into two groups including substantially the same number of circuits, and said two groups are disposed on both sides of said write buffer circuits.

16. The memory according to claim 1, wherein said read amplifier circuits are arranged adjacent to each other, and said write buffer circuits are arranged adjacent to each other so as to be juxtaposed with said read amplifier circuits arranged adjacent to each other.

* * * * *